US006968225B2

(12) United States Patent
Vu

(10) Patent No.: US 6,968,225 B2
(45) Date of Patent: Nov. 22, 2005

(54) REAL-TIME LOCALIZATION, MONITORING, TRIGGERING AND ACQUISITION OF 3D MRI

(75) Inventor: Anthony T. Vu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 589 days.

(21) Appl. No.: 09/682,366

(22) Filed: Aug. 24, 2001

(65) Prior Publication Data

US 2003/0050552 A1 Mar. 13, 2003

(51) Int. Cl.[7] ............................................. A61B 5/055
(52) U.S. Cl. .................... 600/410; 600/413; 600/419; 600/420; 324/309
(58) Field of Search ................. 600/410, 415, 600/419, 420, 413; 324/306, 307, 309

(56) References Cited

U.S. PATENT DOCUMENTS

| 4,830,012 | A | | 5/1989 | Riederer |
| 5,842,989 | A | * | 12/1998 | Zur ............................ 600/410 |
| 6,108,573 | A | | 8/2000 | Debbins et al. |
| 6,166,544 | A | | 12/2000 | Debbins et al. |
| 6,195,579 | B1 | * | 2/2001 | Carroll et al. .............. 600/420 |
| 6,230,040 | B1 | * | 5/2001 | Wang et al. ................. 600/415 |
| 6,275,035 | B1 | | 8/2001 | Debbins et al. |
| 6,459,264 | B1 | * | 10/2002 | Fain et al. ................... 324/307 |
| 6,556,695 | B1 | * | 4/2003 | Packer et al. ............... 382/128 |
| 6,690,961 | B1 | * | 2/2004 | Kaufman et al. ........... 600/410 |
| 6,801,037 | B1 | * | 10/2004 | Zhang ......................... 324/309 |

OTHER PUBLICATIONS

MR Fluoroscopy: Technical Feasibility; Stephen J. Riederer, Talin Tasciyan, Farhad Farzaneh, James N. Lee, Ronald C. Wright and Robert J. Herfkens (Department of Radiology, Duke University Medical Center, Durhan, North Carolina 27710); Magnetic Resonance in Medicine 8, 1-15 (1988).

* cited by examiner

Primary Examiner—Ruth S. Smith
(74) Attorney, Agent, or Firm—Ziolkowski Patent Solutions Group, SC; Michael A. Della Penna; Carl B. Horton

(57) ABSTRACT

A technique embodied in a method and apparatus is disclosed for acquiring MR images in 2D and 3D using a common pulse sequence switchable in real-time. The technique includes identifying a 3D imaging volume and applying a 3D pulse sequence having the slice encoding and rewinder gradients disabled in one dimension. The technique then allows localizing and monitoring by acquiring 2D MR data. When it is desirable to enter a 3D imaging mode, the slice encoding and rewinder gradients are re-enabled in the common pulse sequence for acquisition of 3D MR data.

28 Claims, 4 Drawing Sheets

REAL-TIME LOCALIZATION, MONITORING, TRIGGERING AND ACQUISITION OF 3D MRI

BACKGROUND OF INVENTION

The present invention relates generally to magnetic resonance imaging (MRI), and more particularly, to a method and apparatus for real-time localization, monitoring, triggering, and acquisition of MR images using a 3D real-time interactive imaging technique in MR studies utilizing both 2D and 3D images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Three dimensional MR imaging techniques have been used routinely for high spatial resolution imaging (i.e., thinner contiguous slices, smaller voxel sizes, . . . ) due to an inherently higher SNR advantage over comparable 2D techniques. However, the scan time for 3D imaging is generally longer. It is therefore important to initially localize the volume of interest (VOI) accurately to avoid rescanning due to inaccurate or incomplete coverage of the VOI, especially when the VOI contains small anatomical structures such as found in the inner ears, breast lesions, liver metastases, etc. Additionally, three dimensional imaging of moving objects, such as the heart, coronary arteries, fetuses, etc. would be more efficient if real-time monitoring and localization were available prior to initiating a 3D acquisition. Furthermore, three dimensional breath-held and/or contrast enhanced imaging techniques require accurate timing and monitoring of the contrast agent to ensure consistent image quality.

Therefore, it would be advantageous to be able to localize and monitor in real-time the VOI prior to the triggering of the final, and typically much longer, three dimensional high resolution acquisition.

BRIEF DESCRIPTION OF THE INVENTION

The present invention relates to a technique that uses a common pulse sequence that can be modified and switched in real-time between a two dimensional pulse sequence and a three dimensional pulse sequence to overcome the aforementioned problems.

The present invention includes a technique capable of real-time localization and/or monitoring of the VOI, as well as triggering high resolution 3D acquisition using a single pulse sequence. Generally, the technique includes using a common pulse sequence that is modified in real-time to allow switching between a 2D pulse sequence mode and a 3D pulse sequence mode. When localizing and/or monitoring, it is desirable to acquire images quickly so the common pulse sequence is switched to a 2D pulse sequence, preferably by modifying a standard 3D pulse sequence. Once the VOI is accurately localized, the common pulse sequence is then modified, or switched, to a 3D pulse sequence. The modification and/or switching is performed in real-time, and typically is done within one (1) TR.

In accordance with one aspect of the invention, a method of MR data acquisition is disclosed that includes prescribing a 3D imaging volume, applying a pulse sequence that is applicable as a 3D pulse sequence with slice encoding and rewinder gradients disabled in one dimension, and acquiring 2D MR data to localize the 3D imaging volume. After the 3D imaging volume is localized, the disabled slice encoding and rewinder gradients are enabled and the technique continues by applying the pulse sequence in three dimensions and acquiring 3D MR data of the 3D imaging volume.

In accordance with another aspect of the invention, an MRI apparatus to acquire MR images and switch between 2D and 3D image acquisition in real-time is disclosed. The apparatus includes an MRI system having a number of gradient coils positioned about a bore of a magnet to impress a polarizing magnetic field and an RF transceiver system and an RF modulator controlled by a pulse control module to transmit RF signals to an RF coil assembly to acquire MR images. The MRI apparatus also includes a computer programmed to modify a pulse sequence upon demand between a 2D pulse sequence and a 3D pulse sequence. After applying the pulse sequence selected, MR image data in 2D or 3D is acquired and an MR image is reconstructed.

In accordance with yet another aspect of the invention, a computer program is disclosed for use with an MRI apparatus which, when executed by a computer, causes the computer to use a common pulse sequence to acquire MR images in 2D and 3D, receive an input indicating an operator desire to acquire 2D or 3D images, and if the input is indicative of a desire to acquire a 3D image, apply the common pulse sequence with 3D parameters. However, if the input is indicative of a desire to acquire 2D images, the computer applies the common pulse sequence with 2D parameters.

In accordance with another aspect of the invention, a method is disclosed for acquiring MR images in a 3D MRI study that includes identifying a desired imaging volume, entering a real-time monitoring mode using a modifiable pulse sequence in a 2D mode, and navigating in real-time by acquiring and monitoring 2D images until the desired imaging volume is sufficiently located. The method next includes switching the modifiable pulse sequence from the 2D mode to a 3D mode and then acquiring 3D images of the desired imaging volume.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

DETAILED DESCRIPTION

Figure 1:
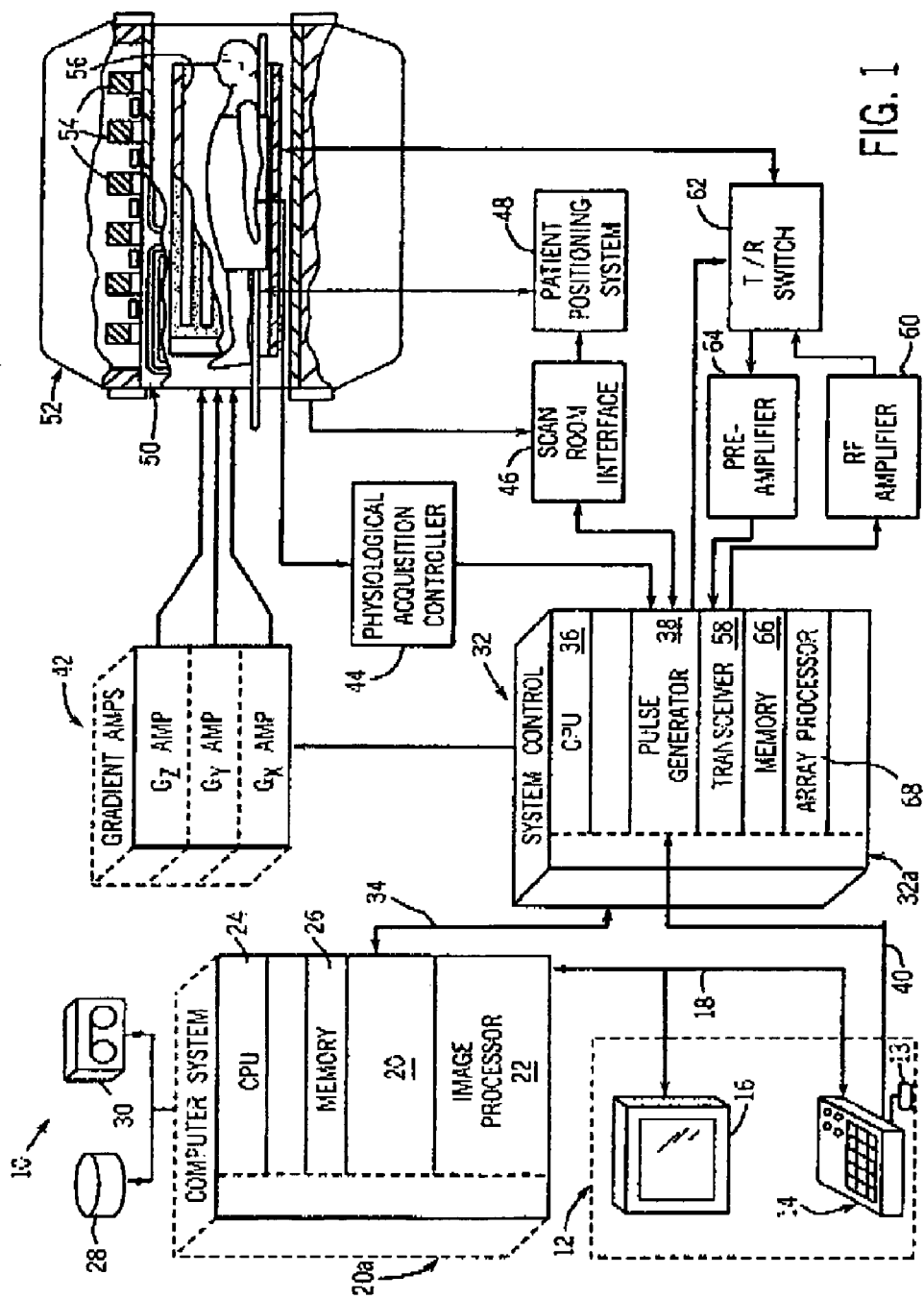
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the abovementioned NMR, or any similar or equivalent system for obtaining 2D and 3D MR images, in which it would advantageous to quickly and efficiently switch between 2D acquisition and 3D acquisition.

Figure 2:
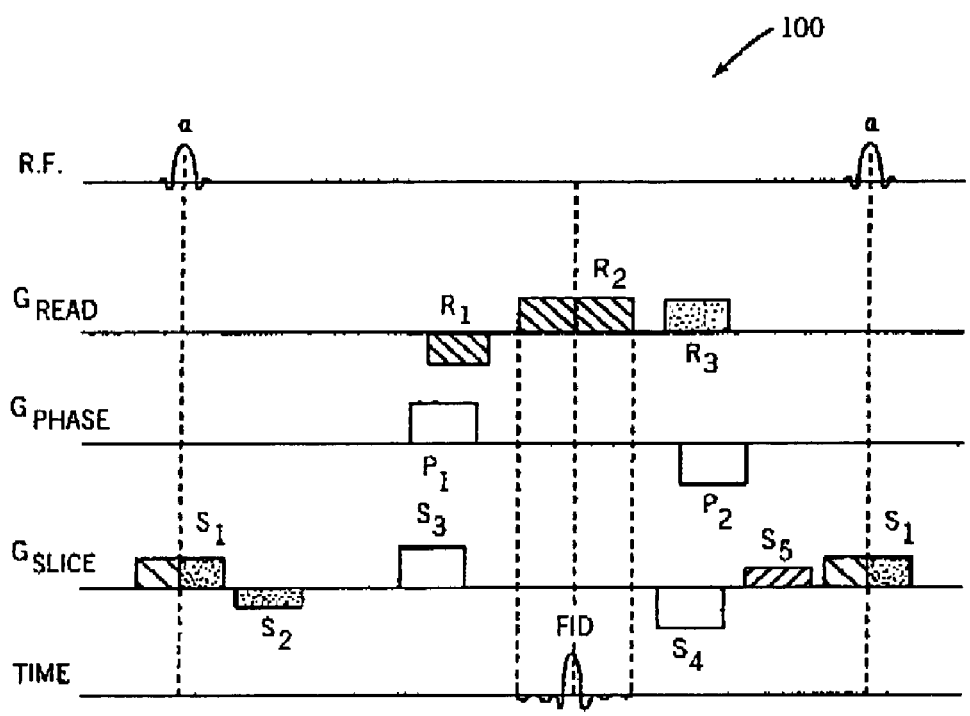
FIG. 2 is a graphical representation of a 3D gradient echo pulse sequence in accordance with the present invention.

Referring to FIG. 2, a 3D gradient echo pulse sequence 100 for high resolution imaging in accordance with the present invention is shown. Although the present invention is applicable generally for any 3D NMR imaging pulse sequence, it is particularly useful where at least one dimension is a phase-encoding third dimension, typically in the slice direction, which would be in addition to the standard second dimension phase encoding. The present invention is further described with respect to a 3D gradient echo with r.f. spoiling (SPGR) imaging pulse sequence for discussion purposes. However, those skilled in the art will readily recognize that the concept is equally applicable for any other 3D NMR imaging technique including, but not limited to, 3D GRE, 3D FIESTA (SSFP), 3D TOF MRA, 3D phase contrast MRA, 3D FSE, 3D SE, 3D EPI, 3D stacked spiral, etc.

As indicated in FIG. 2, the 3D gradient echo imaging pulse sequence 100 is used to acquire high resolution 3D MRI studies with the $R_1$, $R_2$, $R_3$, $P_1$, $P_2$, $S_1$, $S_2$, $S_3$, $S_4$, $S_5$ gradients for read, phase and slice direction, respectively. $P_1$ and $P_2$ are the phase-encoding and rewinder gradients, and $S_3$ and $S_4$ are the slice-encoding and rewinder gradients, respectively. The 3D imaging pulse sequence in FIG. 2 can be implemented to operate in a continuous real-time mode where interactive navigation and imaging parameter modification is allowed. In accordance with the present invention, the 3D imaging pulse sequence 100 of FIG. 2 can be reconfigured in real-time to operate and function as a 2D gradient echo imaging pulse sequence by turning off, or disabling, both $S_3$ and $S_4$ gradients as is shown in FIG. 3.

Figure 3:
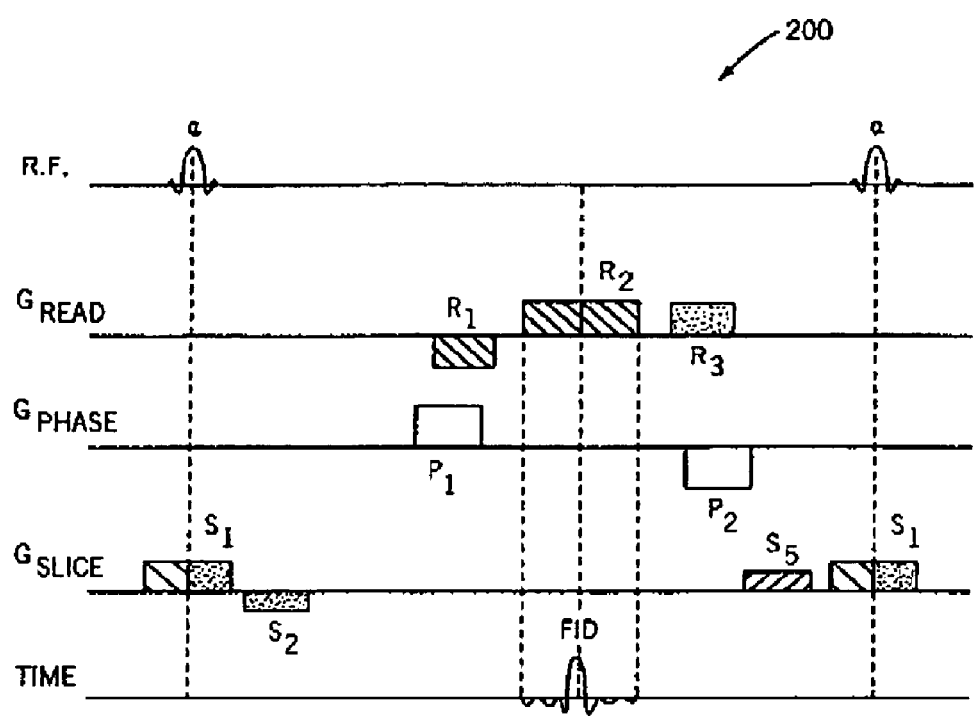
FIG. 3 is a graphical representation of the pulse sequence of FIG. 2, modified for 2D image acquisition, in accordance with the present invention.

The modified 2D imaging pulse sequence 200 is shown in FIG. 3 and can be referred to as a "single slice" 3D acquisition with higher frame rate. However, since the slice encoding gradient is disabled completely in the 2D mode, the acquisition is a true 2D acquisition and not a lowresolution 3D acquisition (i.e. reduces phase encoding along both phase/slice encoding direction). A slab or thick slice equivalent to the 3D volume slab thickness can then be imaged in the 2D mode. The 2D slab thickness can be changed in real-time to improve contrast by varying the $S_1$ gradient amplitude interactively. In some cases, a thinner slice might be desirable so the $S_1$ gradient should be shaped such that it can accommodate a selective excitation of a volume thinner than the original 3D volume without exceeding hardware capability. Spatial saturation capability can also be included and can be switched on/off in real-time to remove the contribution of blood vessels due to time-of-flight effects. Additionally, the FOV and flip angles can be modified in real-time mode for further monitoring flexibility. The real-time monitoring images using the 2D imaging pulse sequence 200 of FIG. 3 can be of the same high in-plane resolution as the prescribed 3D imaging volume while still maintaining an acceptable frame rate. Alternatively, the 2D image in-plane resolution can be adjusted interactively to monitor at a higher frame rate at the expense of lower in-plane resolution. In one embodiment, frame rates up to 10 fps were achieved with adequate resolution.

A real-time continuous scan loop preferably plays out the imaging pulse sequence in FIG. 3 for interactive localization or for monitoring change in the VOI. When the desired VOI is located, or the expected change in VOI is found, the 3D high resolution acquisition can be triggered by restoring slice encoding capability as in FIG. 2. The switching from 2D acquisition mode to 3D acquisition mode can be as fast as one repetition time.

Further, if the critical imaging parameters, such as FOV, slice thickness, matrix size, flip angle, sampling bandwidth, etc., are not changed between real-time acquisitions as the user localizes the monitoring location, the frame rate of the real-time monitoring mode can be accelerated significantly by only acquiring selective relevant portions of the k-space data adaptively and/or re-using other k-space data from previous real-time acquisitions. The acceleration factor is dependent upon the amount of new k-space data acquisition. For example, if only half of k-space data is to be acquired on a subsequent acquisition with the same imaging parameters, an acceleration factor of 2 can be achieved. Therefore, the high in-plane resolution can be maintained while achieving a higher frame rate. The portion of k-space to be acquired on subsequent real-time acquisitions depends on the monitoring application. If a large structure is being monitored, then only the central k-space data needs re-sampling. If a small and finer structure is being monitored, then the outer upper and lower parts of k-space should be re-acquired. For example, in contrast-enhanced MR angiography (MRA) applications, the large vessel of interest (aorta) is monitored for contrast arrival, therefore only the central portion of k-space data need be re-sampled to achieve a higher frame rate while maintaining high spatial resolution.

Conversely, if the critical imaging parameters are changed between real-time acquisitions, the full k-space data should be acquired at least once and subsequent acquisitions can be accelerated as stated above. If the imaging object moves between real-time acquisitions, full k-space data will also need to be re-acquired before the acceleration technique can be used. Movement detection of the imaging object can be accomplished automatically using a simple navigator echo technique or manually by observing changes in the real-time images.

Figure 4:
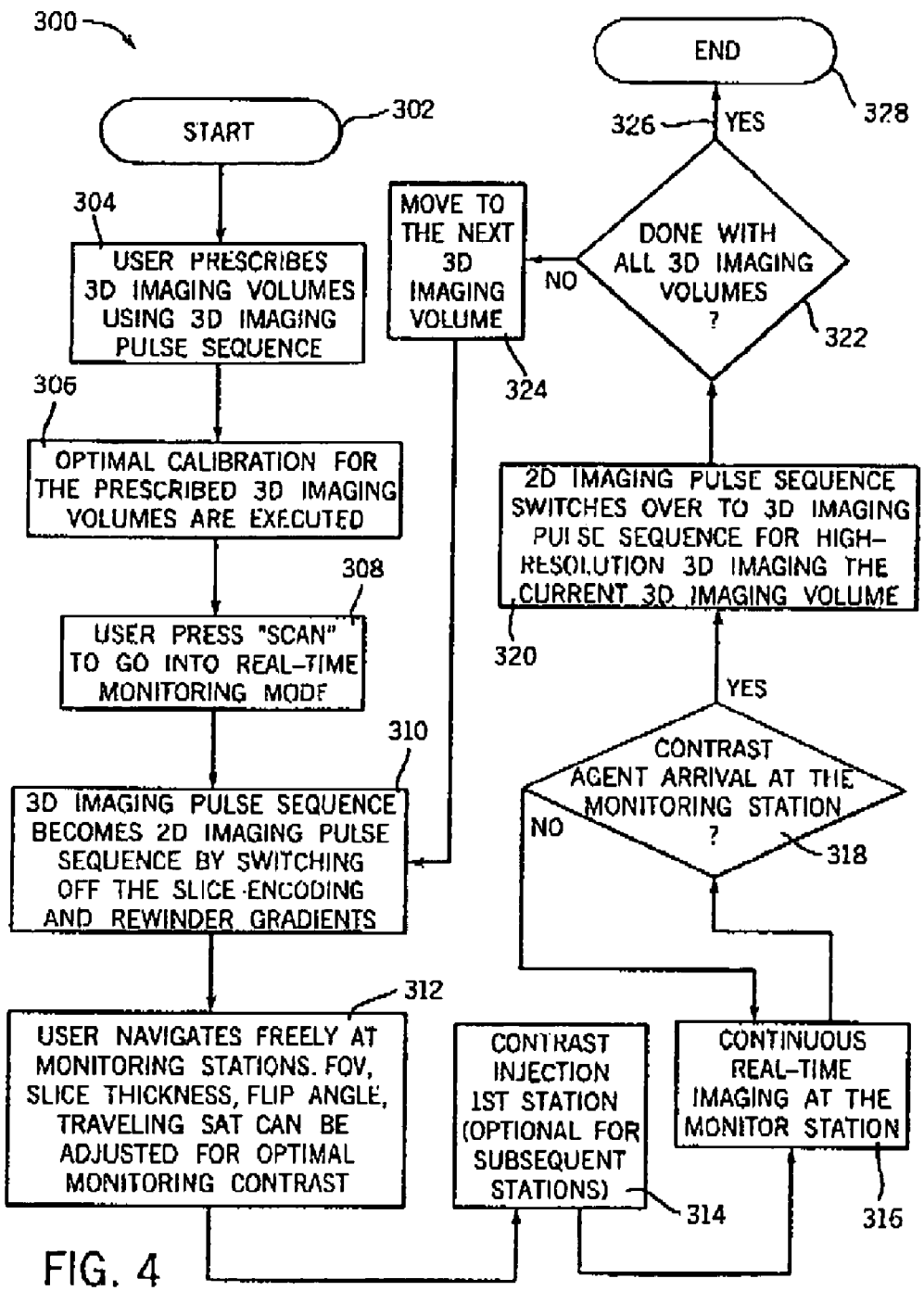
FIG. 4 is a flow chart showing one implementation of the present invention for use with the system of FIG. 1 and the pulse sequence of FIGS. 2 and 3.

Before discussing FIG. 4 in detail, some background in contrast-enhanced MR angiography (MRA) is believed helpful. Contrast-enhanced 3D MRA is routinely used in clinical practice for imaging the aorta, carotid arteries, peripheral arteries, portal and systemic veins, etc. The concept behind contrast-enhanced 3D MRA is to shorten the T1 relaxation time of blood as much as possible during a volumetric data acquisition. It is desirable to reduce the T1 relaxation time of blood to a value of approximately 20 ms. Blood with such a short T1 will appear bright when imaged with a very short relaxation time (TR of approximately 5 ms.), whereas other tissue, including fat, will appear dark. The imaging pulse sequence typically used is a spoiled 3D gradient-echo sequence (3D SPGR) with a very short TR and TE. Typical sequence parameters are TR=4.5 ms., TE=1.5 ms., and a flip angle of approximately 45°. Slab thickness usually is on the order of 1 to 3 mm. Scan time can range from as little as 10 seconds for carotid MRA to as long as 30 seconds for a high resolution MRA of the peripheral arteries. Near perfect timing of the contrast agent bolus is crucial to ensure that the maximum arterial phase occurs during the middle of the acquisition when the central k-space data is acquired. It is also essential that contrast concentration does not change too rapidly to minimize "ringing" artifacts.

Bolus timing is difficult because the time required for the contrast agent bolus to travel from the injection site, typically a vein, to the artery being imaged is highly variable. For renal arteries, it may be only 10 seconds in a young, healthy person, but in older patients with congestive heart failure, it may be as long as 50 seconds or more. The relative timing of contrast agent administration and data acquisition is extremely important in order to ensure a consistent quality for MRA. One particular method to determine relative timing is MR fluoroscopy in which a separate 2D imaging pulse sequence is used to monitor arrival of the contrast and then a separate, 3D imaging pulse sequence is used to acquire the central k-space during the peak concentration of the arterial phase. However, MR fluoroscopy has not been widely used due to the complexity of implementing a 2D/3D switching and acquisition technique. Additionally, such known techniques require specialized hardware and software for quickly switching between two different pulse sequences.

The present invention provides a technique for detecting the arrival of the contrast bolus in the region of interest using real-time interactive 3D imaging. This technique provides real-time continuous monitoring of the contrast agent bolus and real-time triggering of the high resolution 3D MRA acquisition using a common 3D imaging pulse sequence. The previously described generalized technique, is applicable to the 3D MRA acquisition. By playing out the imaging pulse sequence 200 of FIG. 3 prior to the contrast injection in a real-time continuous scan loop, and repeating the loop continuously during the administration of the contrast agent to the patient, 2D images can be quickly acquired of the monitor station and displayed continuously in real-time for accurate monitoring. When the real-time 2D images show significant changes in vascular signal intensity due to the arrival of the contrast bolus, the acquisition of high resolution contrast enhanced 3D MRA data can then be performed, either manually by the operator or automatically by a detection algorithm to immediately switch operating modes from the real-time continuous 2D scan loop to the 3D imaging pulse sequence of FIG. 2. In one embodiment, switching times as fast as one repetition time (~5 ms) were achieved. If a delay period after the detection of the arrival of the bolus is desirable before 3D imaging, for breath-held preparation purposes, such a delay period can be prescribed in real-time.

FIG. 4 shows an operational flow chart of the 3D real-time interactive imaging method for monitoring, triggering, and acquisition of multiple 3D imaging volumes, such as in the case peripheral vascular run-off studies. The 3D imaging pulse sequence adaptively switches between 2D monitoring and 3D acquisition modes for each of the prescribed 3D imaging volumes. As in the single station case, switching can be done manually by human operator, or automatically by advanced detection algorithms. After the 3D real-time interactive monitoring, triggering, and acquisition of multiple 3D imaging stations in a contrast-enhanced MRA algorithm 300 is initiated 302, the user, or operator, prescribes the desired 3D imaging volumes using a 3D imaging pulse sequence, such as that shown in FIG. 2 at 304. The necessary calibration for the 3D imaging volumes is then executed 306, and the user can then enter the real-time monitoring mode 308. The 3D imaging pulse sequence of FIG. 2 is then modified to the 2D imaging pulse sequence at 310, as shown in FIG. 3 and as previously described. The operator is then allowed to navigate and/or adjust the critical parameters for optimal monitoring 312. After injecting contrast agent 314, real-time imaging can begin 316, and once contrast agent arrives at the monitoring station 318, the 2D pulse sequence is switched back to the 3D imaging pulse sequence for high resolution 3D imaging of the present 3D imaging volume 320. If additional 3D imaging volumes were prescribed 322, the system moves to the next 3D imaging volume 324 and the pulse sequence is switched back to 2D imaging. Once all the 3D imaging volumes have been acquired 322, 326 the algorithm is completed at 328.

For contrast-enhanced MRA, one can prescribe a fixed 3D imaging volume, then go into the 2D real-time navigating mode and monitor the contrast possibly at a very different location and then switch back to 3D at the previous prescribed location. Additionally, for localization, one can just prescribe a 3D imaging volume, which may be at iso-center, then go into the 2D real-time navigating mode to find the actual 3D volume and then switch back to 3D mode to image that new 3D volume.

Accordingly, the present invention includes a method of MR data acquisition that includes prescribing a 3D imaging volume, applying a pulse sequence that is applicable as a 3D pulse sequence with slice encoding and rewinder gradients disabled in one dimension, and acquiring 2D MR data to localize the 3D imaging volume. After the 3D imaging volume is localized, the disabled slice encoding and rewinder gradients are enabled and the technique continues by applying the pulse sequence in three dimensions and acquiring 3D MR data of the 3D imaging volume.

The present invention includes an MRI apparatus to acquire MR images and switch between 2D and 3D image acquisition in real-time is disclosed. The apparatus includes an MRI system having a number of gradient coils positioned about a bore of a magnet to impress a polarizing magnetic field and an RF transceiver system and an RF modulator controlled by a pulse control module to transmit RF signals to an RF coil assembly to acquire MR images. The MRI apparatus also includes a computer programmed to modify a pulse sequence upon demand between a 2D pulse sequence and a 3D pulse sequence. After applying the pulse sequence selected, MR image data in 2D or 3D is acquired and an MR image is reconstructed.

The presents invention also includes a computer program for use with an MRI apparatus which, when executed by a computer, causes the computer to use a common pulse sequence to acquire MR images in 2D and 3D, receive an input indicating an operator desire to acquire 2D or 3D images, and if the input is indicative of a desire to acquire a 3D image, apply the common pulse sequence with 3D parameters. However, if the input is indicative of a desire to acquire 2D images, the computer applies the common pulse sequence with 2D parameters.

A method is additionally disclosed for acquiring MR images in a 3D MRI study that includes identifying a desired imaging volume, entering a real-time monitoring mode using a modifiable pulse sequence in a 2D mode, and navigating in real-time by acquiring and monitoring 2D images until the desired imaging volume is sufficiently located. The method next includes switching the modifiable pulse sequence from the 2D mode to a 3D mode and then acquiring 3D images of the desired imaging volume.

The present invention has been described in terms of the preferred embodiment, and it is recognized that equivalents, alternatives, and modifications, aside from those expressly stated, are possible and within the scope of the appending claims.

The present invention has been described in terms of the preferred embodiment, and it is recognized that equivalents, alternatives, and modifications, aside from those expressly stated, are possible and within the scope of the appending claims.

What is claimed is:

1. A method of MR data acquisition comprising:
    prescribing a 3D imaging volume;
    applying a pulse sequence that is applicable as a 3D pulse sequence with slice encoding and rewinder gradients disabled in one dimension;
    acquiring 2D MR data to localize the 3D imaging volume;
    enabling the disabled encoding and rewinder gradients in the pulse sequence;
    applying the pulse sequence in three dimensions; and
    acquiring 3D MR data of the 3D imaging volume.

2. The method of claim 1 further comprising the step of modifying the pulse sequence between a 2D pulse sequence and a 3D pulse sequence in real-time and on-the-fly.

3. The method of claim 1 further comprising the step of allowing adjustment of at least one of an FOV, a slice thickness, flip angle, matrix size, sampling bandwidth, and spatial saturation between real-time data acquisitions.

4. The method of claim 3 further comprising the step of acquiring full k-space data for one MR data acquisition after an adjustment, and then acquiring partial k-space data thereafter until a subsequent adjustment.

5. The method of claim 1 wherein the steps of acquiring 2D MR data is sped up by first acquiring one set of complete k-space data, and then acquiring a subset of k-space data thereafter.

6. The method of claim 1 further comprising the step of detecting object movement during real-time data acquisition and if object movement is detected, acquiring full k-space data for at least one MR data acquisition and acquiring partial k-space data thereafter.

7. The method of claim 6 wherein the step of detecting is performed by one of an automated detection using a navigator echo technique and manual observation of real-time generated images.

8. The method of claim 1 further comprising the step of switching from 2D MR data acquisition to 3D data acquisition within one repetition time (TR).

9. The method of claim 1 as used in an MRA exam and further comprising:
    injecting a contrast agent;

continuously applying the pulse sequence, acquiring 2D MR data, and displaying images in real-time until an arrival of the contrast agent in a monitor station; and then, switching the pulse sequence to 3D acquisition and acquiring 3D MR data for the prescribed 3D imaging volume.

10. The method of claim 9 further comprising the step of adaptively switching between a 2D monitor mode and a 3D acquisition mode for each of a number of prescribed 3D imaging volumes.

11. An MRI apparatus to acquire MR images and switch between 2D and 3D image acquisition in real-time comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
modify a selected pulse sequence upon demand between a 2D pulse sequence and a 3D pulse sequence;
apply the selected pulse sequence and acquire MR image data in 2D or 3D based on the selected pulse sequence as modified on demand; and
reconstruct MR images; and the MRI apparatus further comprising a user input to select the modification of the selected pulse sequence and wherein the modification is made within one repetition time of the selected pulse sequence.

12. The MRI apparatus of claim 11 wherein the selected pulse sequence is a conventional 3D pulse sequence when in a 3D pulse sequence mode and has the slice encoding and rewinder gradients disabled in a 2D pulse sequence mode.

13. The MRI apparatus of claim 11 further comprising a user input to adjust at least one of an FOV, a slice thickness, flip angle, matrix size, sampling bandwidth, and spatial saturation between real-time data acquisitions.

14. The MRI apparatus of claim 13 wherein the computer is further programmed to acquire full k-space for one MR data acquisition after an adjustment, and then acquire partial k-space data thereafter until a subsequent adjustment.

15. The MRI apparatus of claim 11 wherein the computer is further programmed to detect object movement during real-time data acquisition and if object movement is detected, acquiring full k-space data for at least one MR data acquisition and acquiring partial k-space data thereafter.

16. The MRI apparatus of claim 11 wherein the computer is further programmed to accelerate MR image data acquisition by first acquiring one set of complete k-space data, and then acquiring a subset of k-space data thereafter.

17. A computer program stored on a computer readable storage medium having a set of instructions executable by a computer to cause the computer to:

use a common pulse sequence to acquire MR images in 2D and 3D;
receive an input indicating an operator desire to acquire 2D or 3D images;
if the input is indicative of a desire to acquire 3D images, apply the common pulse sequence with 3D parameters;
if the input is indicative of a desire to acquire 2D images, disable parameters in a third dimension in real-time to modify the common pulse sequence to create and apply an effective pulse sequence with 2D parameters;
acquire MR data; and
reconstruct an MR image.

18. The computer program of claim 17 that further causes the computer to accept an input allowing adjustment of at least one of an FOV, a slice thickness, flip angle, matrix size, sampling bandwidth, and spatial saturation between real-time data acquisitions.

19. The computer program of claim 18 that further causes the computer to acquire full k-space data for one MR data acquisition after an adjustment, and then acquire partial k-space data thereafter until a subsequent adjustment.

20. The computer program of claim 17 that further causes the computer to detect object movement during real-time data acquisition and if object movement is detected, acquire full k-space data for at least one MR data acquisition and acquire partial k-space data thereafter.

21. The computer program of claim 17 that further causes the computer to accelerate data acquisition by first acquiring one set of complete k-space data, and then acquire a subset of k-space data thereafter.

22. The computer program of claim 17 that further causes the computer to convert the common pulse sequence from 3D to 2D within a single repetition time.

23. An MRI apparatus to acquire MR images and switch between 2D and 3D image acquisition in real-time comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
modify a pulse sequence upon demand between a 2D pulse sequence and a 3D pulse sequence;
apply the pulse sequence and acquire MR image data in 2D and 3D based on the pulse sequence as modified on demand;
reconstruct MR images; and a user input to select to modification of the pulse sequence and wherein the modification is made within one repetition time of the pulse sequence.

24. An MRI apparatus to acquire MR images and switch between 2D and 3D image acquisition in real-time comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil Assembly to acquire MR images; and a computer programmed to:
modify a pulse sequence upon demand between a 2D pulse sequence and a 3D pulse sequence;
apply the pulse sequence and acquire MR image data in 2D and 3D based on the pulse sequence as modified on demand;
reconstruct MR images; and
detect object movement during real-time data acquisition and if object movement is detected, acquiring full k-space data for at least one MR data acquisition ad acquiring partial k-space data thereafter.

25. An MRI apparatus to acquire MR images and switch between 2D and 3D image acquisition in real-time comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
modify a selected pulse sequence upon demand between a 2D pulse sequence and a 3D pulse sequence;
apply the selected pulse sequence and acquire MR image data in 2D or 3D based on the selected pulse sequence as modified on demand;
reconstruct MR images; and
wherein the selected pulse sequence is a conventional 3D pulse sequence when in a 3D pulse sequence mode and has the slice encoding and rewinder gradients disabled in a 2D pulse sequence mode.

26. An MRI apparatus to acquire MR images and switch between 2D and 3D image acquisition in real-time comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
modify a selected pulse sequence upon demand between a 2D pulse sequence and a 3D pulse sequence;
apply the selected pulse sequence and acquire MR image data in 2D or 3D based on the selected pulse sequence as modified on demand;
reconstruct MR images; and
wherein the computer is further programmed to detect object movement during real-time data acquisition and if object movement is detected, acquiring full k-space data for at least one MR data acquisition and acquiring partial k-space data thereafter.

27. A computer program stored on a computer readable storage medium having a set of instructions executable by a computer to cause the computer to:
use a common pulse sequence to acquire MR images in 2D or 3D;
receive an input indicating an operator desire to acquire 2D or 3D images;
if the input is indicative of a desire to acquire 3D images, apply the common pulse sequence with 3D parameters;
if the input is indicative of a desire to acquire 2D images, apply the common pulse sequence with 2D parameters; and
detect object movement during real-time data acquisition and if object movement is detected, acquire full k-space data for at least one MR data acquisition and acquire partial k-space data thereafter.

28. A computer program stored on a computer readable storage medium having a set of instructions executable by a computer to cause the computer to:
use a common pulse sequence to acquire MR images in 2D or 3D;
receive an input indicating an operator desire to acquire 2D or 3D images;
if the input is indicative of a desire to acquire 3D images, apply the common pulse sequence with 3D parameters;
if the input is indicative of a desire to acquire 2D images, convert the common pulse sequence from 3D to 2D within a single repetition time and apply the common pulse sequence with 2D parameters.

* * * * *

UNITED STATES PATENT AND TRADEMARK OFFICE
CERTIFICATE OF CORRECTION

PATENT NO. : 6,968,225 B2
DATED : November 22, 2005
INVENTOR(S) : Vu

It is certified that error appears in the above-identified patent and that said Letters Patent is hereby corrected as shown below:

Column 9,
Line 57, delete "and" and substitute -- or --;

Column 10,
Line 39, delete second "to" and substitute -- the --.

Signed and Sealed this

Seventh Day of February, 2006

JON W. DUDAS
*Director of the United States Patent and Trademark Office*